US011955285B2

(12) United States Patent
Kwong

(10) Patent No.: US 11,955,285 B2
(45) Date of Patent: Apr. 9, 2024

(54) STRUCTURE AND METHODS OF FORMING THE STRUCTURE

(71) Applicant: Lodestar Licensing Group, LLC, Evanston, IL (US)

(72) Inventor: Tae Heui Kwong, Seoul (KR)

( * ) Notice: Subject to any disclaimer, the term of this patent is extended or adjusted under 35 U.S.C. 154(b) by 853 days.

(21) Appl. No.: 17/067,587

(22) Filed: Oct. 9, 2020

(65) Prior Publication Data

US 2021/0098196 A1 Apr. 1, 2021

Related U.S. Application Data

(60) Division of application No. 16/237,341, filed on Dec. 31, 2018, now Pat. No. 10,804,036, which is a continuation of application No. 15/948,740, filed on Apr. 9, 2018, now Pat. No. 10,170,248, which is a continuation of application No. 15/676,597, filed on Aug. 14, 2017, now Pat. No. 9,941,053, which is a continuation of application No. 14/790,414, filed on Jul. 2, 2015, now Pat. No. 9,734,949, which is a
(Continued)

(51) Int. Cl.
| | |
|---|---|
| *H01G 4/30* | (2006.01) |
| *H01G 4/005* | (2006.01) |
| *H01G 4/06* | (2006.01) |
| *H01L 23/52* | (2006.01) |
| *H01L 23/522* | (2006.01) |
| *H01L 23/535* | (2006.01) |

(52) U.S. Cl.
CPC .............. *H01G 4/30* (2013.01); *H01G 4/005* (2013.01); *H01G 4/06* (2013.01); *H01L 23/52* (2013.01); *H01L 23/522* (2013.01); *H01L 23/535* (2013.01); *Y10T 29/43* (2015.01)

(58) Field of Classification Search
CPC . H01G 4/005; H01G 4/06; H01G 4/30; H01L 23/52; H01L 23/522; H01L 23/535; Y10T 29/43
USPC ......................................................... 438/171
See application file for complete search history.

(56) References Cited

U.S. PATENT DOCUMENTS

| | | | |
|---|---|---|---|
| 5,745,335 A | 4/1998 | Watt | |
| 6,351,406 B1 * | 2/2002 | Johnson | G11C 17/14 365/103 |

(Continued)

FOREIGN PATENT DOCUMENTS

| | | |
|---|---|---|
| CN | 103843137 A | 6/2014 |
| CN | 103843137 B | 11/2018 |

(Continued)

OTHER PUBLICATIONS

U.S. Appl. No. 13/214,902 U.S. Pat. No. 9,082,555, filed Aug. 22, 2011, A Structure Comprising Multiple Capacitors and Methods for Forming the Structure.
(Continued)

*Primary Examiner* — Monica D Harrison
(74) *Attorney, Agent, or Firm* — Fletcher Yoder, P.C.

(57) ABSTRACT

Capacitors, apparatus including a capacitor, and methods for forming a capacitor are provided. One such capacitor may include a first conductor a second conductor above the first conductor, and a dielectric between the first conductor and the second conductor. The dielectric does not cover a portion of the first conductor; and the second conductor does not cover the portion of the first conductor not covered by the dielectric.

10 Claims, 15 Drawing Sheets

Related U.S. Application Data division of application No. 13/214,902, filed on Aug. 22, 2011, now Pat. No. 9,082,555.

(56) References Cited

U.S. PATENT DOCUMENTS

| | | | |
|---|---|---|---|
| 7,317,221 | B2 | 1/2008 | Chang et al. |
| 7,623,338 | B2 | 11/2009 | Won |
| 8,294,159 | B2 * | 10/2012 | Or-Bach ............ H01L 27/0688 257/74 |
| 9,082,555 | B2 | 7/2015 | Kwong |
| 9,734,949 | B2 | 8/2017 | Kwong |
| 9,941,053 | B2 | 4/2018 | Kwong |
| 10,170,248 | B2 | 1/2019 | Kwong |
| 10,804,036 | B2 | 10/2020 | Kwong et al. |
| 2002/0070402 | A1 | 6/2002 | Ichige et al. |
| 2005/0121744 | A1 | 6/2005 | Chang et al. |
| 2007/0146962 | A1 | 6/2007 | Ki |
| 2007/0252201 | A1 * | 11/2007 | Kito .................. H10B 69/00 257/E21.679 |
| 2008/0157152 | A1 | 7/2008 | Shim |
| 2009/0096062 | A1 | 4/2009 | Bang |
| 2009/0141426 | A1 | 6/2009 | Hwang |
| 2010/0176440 | A1 | 7/2010 | Omura |
| 2010/0238603 | A1 | 9/2010 | Chung |
| 2010/0246091 | A1 | 9/2010 | Komuro et al. |
| 2010/0246092 | A1 | 9/2010 | Shibue et al. |
| 2010/0279484 | A1 | 11/2010 | Wang et al. |
| 2011/0012188 | A1 | 1/2011 | Kito et al. |
| 2013/0051126 | A1 | 2/2013 | Kwong |
| 2015/0310992 | A1 | 10/2015 | Kwong |
| 2017/0345573 | A1 | 11/2017 | Kwong |
| 2018/0226196 | A1 | 8/2018 | Kwong |
| 2019/0198250 | A1 | 6/2019 | Kwong |

FOREIGN PATENT DOCUMENTS

| | | |
|---|---|---|
| CN | 109727994 A | 5/2019 |
| JP | 2010109014 A | 5/2010 |
| KR | 1020070019248 A | 2/2007 |
| KR | 101648648 B1 | 8/2016 |
| WO | WO-2013028693 A2 | 2/2013 |
| WO | WO-2013028693 A3 | 2/2013 |

OTHER PUBLICATIONS

U.S. Appl. No. 14/790,414 U.S. Pat. No. 9,734,949, filed Jul. 2, 2015, A Structure and Methods of Forming the Structure.
U.S. Appl. No. 15/676,597 U.S. Pat. No. 9,941,053, filed Aug. 14, 2017, A Structure and Methods of Forming the Structure.
U.S. Appl. No. 15/948,740 U.S. Pat. No. 10,170,248, filed Apr. 9, 2018, A Structure and Methods of Forming the Structure.
U.S. Appl. No. 16/237,341 U.S. Pat. No. 10,804,036, filed Dec. 31, 2018, A Structure and Methods of Forming the Structure.
"Chinese Application Serial No. 201280048397.0 Response filed May 22, 2015 to Office Action dated Mar. 4, 2015", w/English Claims, 16 pgs.
"Chinese Application Serial No. 201280048397.0, Amendment filed Aug. 22, 2014" 6 pgs.
"Chinese Application Serial No. 201280048397.0, Decision of Rejection dated Feb. 4, 2017", W/ English Translation, 12 pgs.
"Chinese Application Serial No. 201280048397.0, Office Action dated Jan. 7, 2015", w/English Translation, 14 pgs.
"Chinese Application Serial No. 201280048397.0, Office Action dated Feb. 26, 2016", With English Translation, 6 pgs.
"Chinese Application Serial No. 201280048397.0, Office Action dated Aug. 17, 2016", W/ English Translation, 16 pgs.
"Chinese Application Serial No. 201280048397.0, Office Action dated Sep. 16, 2015", w/English Translation, 4 pgs.
"Chinese Application Serial No. 201280048397.0, Response filed May 19, 2016 to Office Action dated Feb. 26, 2016", W/ English Translation Of Claims, 22 pgs.
"Chinese Application Serial No. 201280048397.0, Response Filed May 19, 2017 to Decision for Rejection dated Feb. 4, 2017", No English Translation, 7 pgs.
"Chinese Application Serial No. 201280048397.0, Response filed Nov. 1, 2016 to Office Action dated Aug. 17, 2016", w/English Claims, 22 pgs.
"Chinese Application Serial No. 201280048397.0, Response filed Nov. 27, 2015 to Office Action dated Sep. 16, 2015", w/English Claims, 23 pgs.
"International Application Serial No. PCT/U82012/051727, Demand/ Art 34 Amendment filed Jun. 21, 2013", 26 pgs.
"International Application Serial No. PCT/U82012/051727, International Preliminary Report on Patentability dated Nov. 22, 2013", 28 pgs.
"International Application Serial No. PCT/US2012/051727, International Search Report dated Feb. 26, 2013", 3 pgs.
"International Application Serial No. PCT/US2012/051727, Written Opinion dated Feb. 26, 2013", 6 pgs.
"Korean Application Serial No. 10-2014-7007504, Office Action dated Nov. 25, 2015", W/ English Translation, 22 pgs.
"Korean Application Serial No. 10-2014-7007504, Response filed Mar. 25, 2016 to Office Action dated Nov. 25, 2015", (English Translation of Claims), 22 pgs.

* cited by examiner

US 11,955,285 B2

STRUCTURE AND METHODS OF FORMING THE STRUCTURE

PRIORITY APPLICATION

This application is a divisional of U.S. application Ser. No. 16/237,341, filed Dec. 31, 2018, which is a continuation of U.S. application Ser. No. 15/948,740, filed Apr. 9, 2018, now issued as U.S. Pat. No. 10,170,248, which is a continuation of U.S. application Ser. No. 15/676,597, filed Aug. 14, 2017, now issued as U.S. Pat. No. 9,941,053, which is a continuation of U.S. application Ser. No. 14/790,414, filed Jul. 2, 2015, now issued as U.S. Pat. No. 9,734,949, which is a divisional of U.S. application Ser. No. 13/214,902, filed Aug. 22, 2011, all of which are incorporated herein by reference in their entirety.

TECHNICAL FIELD

The present disclosure relates generally to capacitors and, in a particular embodiment, to a parallel plate capacitor for storing and providing electrical energy to a variety of devices, including semiconductor devices.

BACKGROUND

Capacitors are a basic electrical element used in storing and providing electrical energy to other electrical elements. They are used in most of today's electrical and/or electronic devices and continue to expand its range of applications into new types of hi-tech devices, such as semiconductor devices, as technologies rapidly evolve. While there are a vast array of capacitors (e.g., metal oxide field effect transistor (MOSFET) capacitors) available to be used in such semiconductor devices, as the density of the semiconductor devices have exponentially and steadily increased over the years, there have been incessant and increasing demands for capacitors that are smaller in size but greater in storage capacity.

DETAILED DESCRIPTION

Figure 1A:
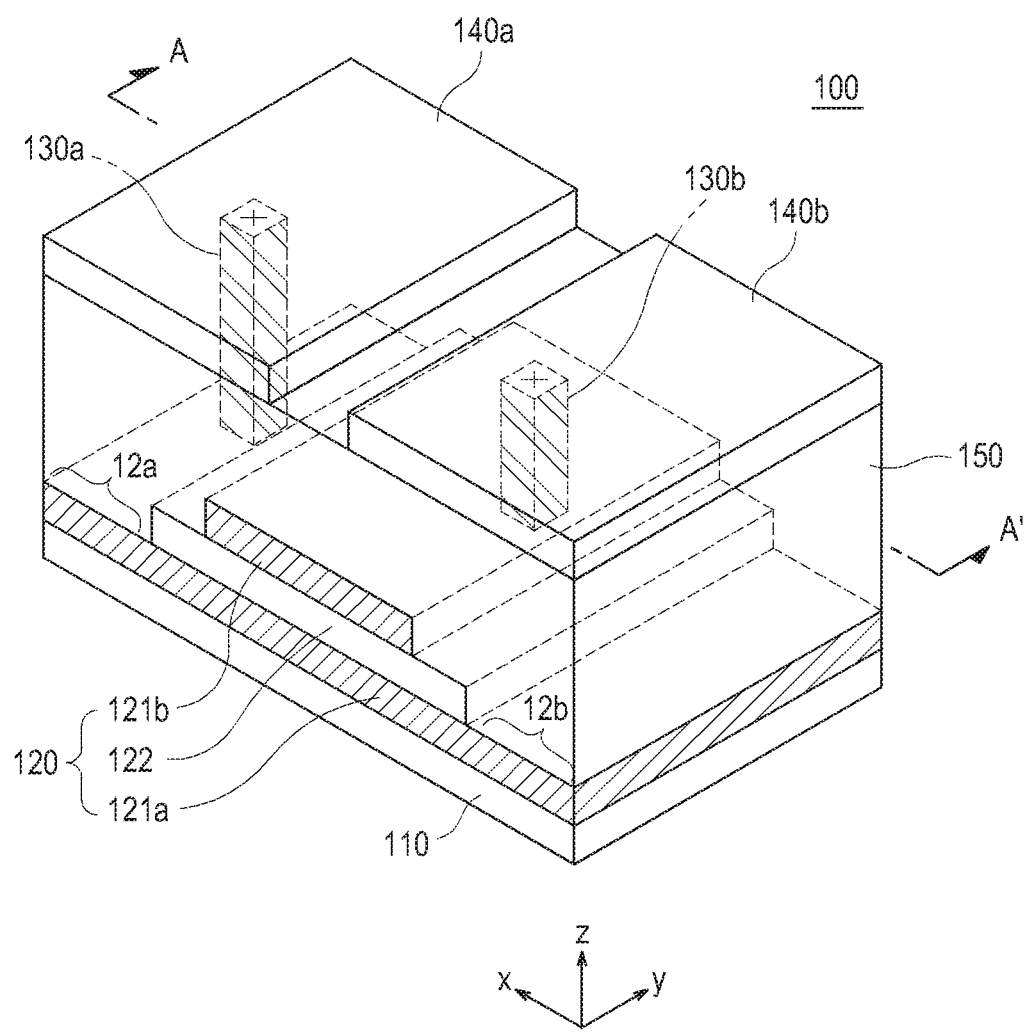
FIG. 1A shows a perspective view of one illustrative embodiment of a capacitor.

Techniques relating to a capacitor are provided. In one embodiment, the capacitor may include a first conductor, a second conductor above the first conductor, and a dielectric between the first conductor and the second conductor. The dielectric does not cover a portion of the first conductor; and the second conductor does not cover the portion of the first conductor not covered by the dielectric.

In another embodiment, a capacitor may include N planar conductors disposed one above the other, each of the planar conductors including at least one first portion not covered by the planar conductor disposed above thereof, wherein N is a natural number equal to or greater than two.

The foregoing embodiments are illustrative only and are not intended to be in any way limiting. In addition to the illustrative aspects, embodiments, and features described above, further aspects, embodiments, and features will become apparent by reference to the drawings and the following detailed description.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Figure 1B:
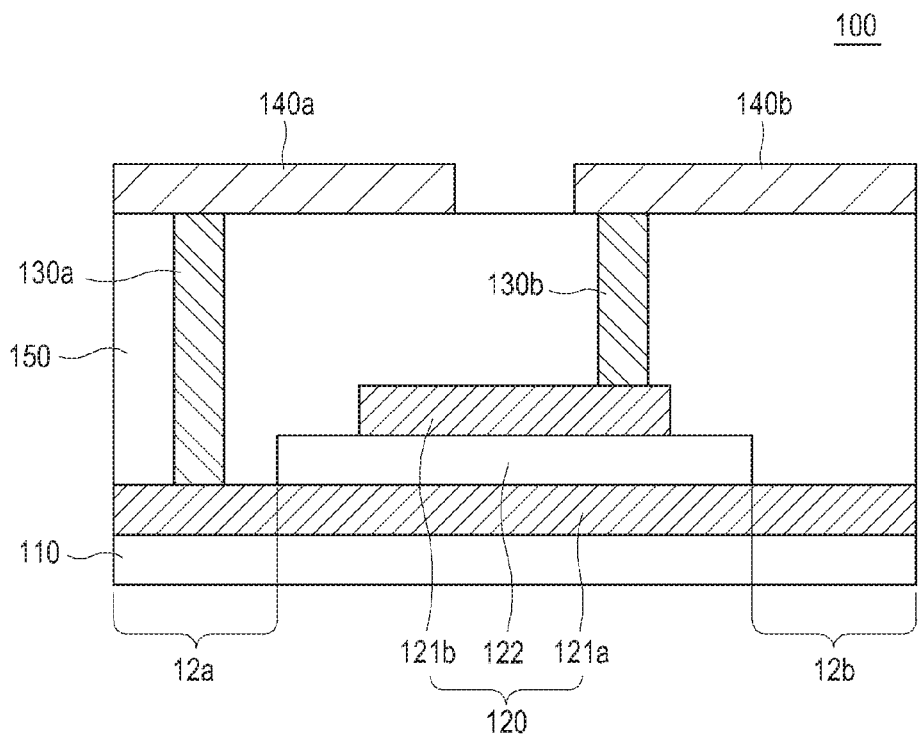
FIG. 1B shows a cross-sectional view of the capacitor shown in FIG. 1A taken along line A-A'.
Figure 1C:
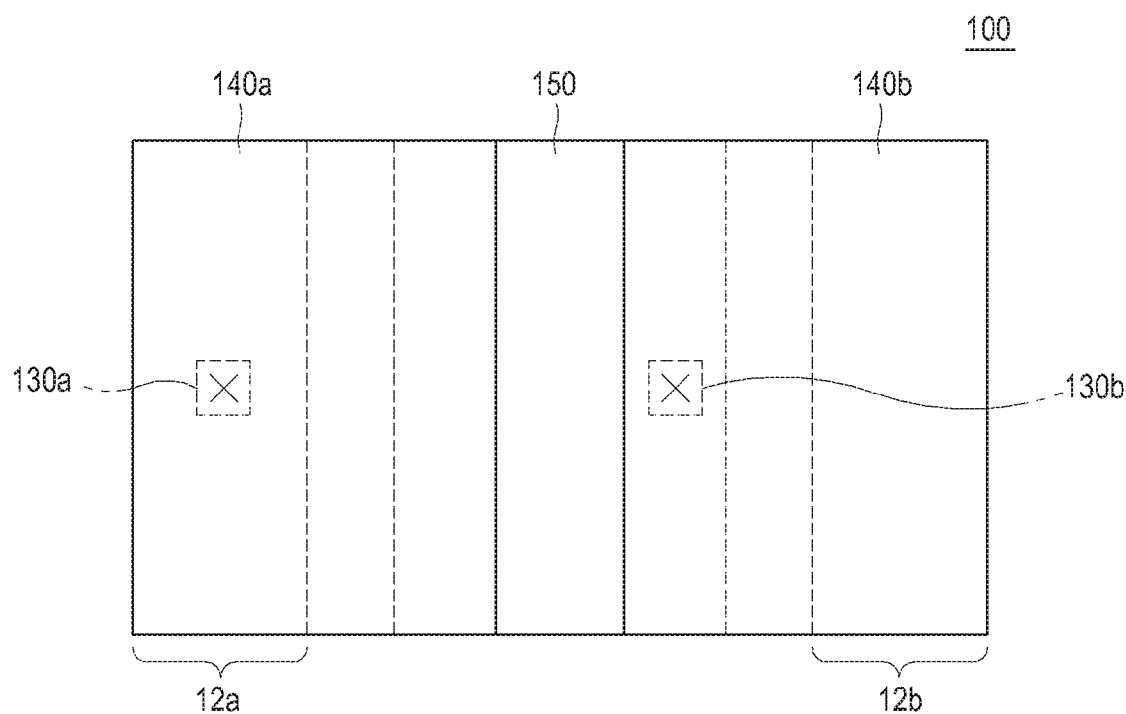
FIG. 1C shows a planar view of the capacitor shown in FIG. 1A.

FIG. 1A shows a perspective view of one illustrative embodiment of a capacitor. FIG. 1B shows a cross-sectional view of the capacitor shown in FIG. 1A taken along line A-A'. FIG. 1C shows a planar view of the capacitor shown in FIG. 1A. Referring to FIGS. 1A-1C, a capacitor 100 may include a substrate 110, and a stacked body 120 provided on substrate 110. While not expressly illustrated in FIGS. 1A-1C for the sake of simplicity, a dielectric material, such as silicon oxide, may be interposed between substrate 110 and stacked body 120. Stacked body 120 may include first and second planar conductors (e.g., first and second planar conductive layers 121a and 121b; hereinafter may be collectively referred to as planar conductive layers 121) disposed one above the other and substantially parallel to each other, and a dielectric (e.g., a dielectric layer 122) interposed therebetween. In one embodiment, second planar conductive layer 121b and dielectric layer 122 may be disposed on first conductive layer 121a to respectively cover only a portion(s) of the upper surface of underlying first conductive layer 121a, such that first conductive layer 121a may include one or more upper surface portions that are not covered by overlying second planar conductive layer 121b and dielectric layer 122 (e.g., first and second upper surface portions 12a and 12b). By way of a non-limiting example, one or more upper surface portions 12a and 12b may be the end portions of first planar conductive layer 121a, such that they, together with second planar conductive layer 121b and first dielectric layer 122, may form one or more stair steps at one or more sides of capacitor 100.

In one embodiment, as shown in FIGS. 1A-1C, second planar conductive layer 121b may be smaller than its underlying first planar conductive layer 121a in at least one of its two extending dimensions. For convenience of description, an xyz coordinate system is shown in FIG. 1A. The x and z axes in the this coordinate system respectively indicate the two orthogonal directions along which planar conductive layers 121 may extend, and the z axis indicate the direction that is orthogonal to the x and y axes. In the above coordinate system, second planar conductive layer 121b may be smaller than its underlying first planar conductive layer 121a in at least one of the two dimensions in the directions of x and y axes shown in FIG. 1A. Further, in the above embodiment, second planar conductive layer 121b may be equal to or smaller than its underlying dielectric layer 122 in at least one of its two extending dimensions (e.g., the two dimensions in the direction of x and y axes shown in FIG. 1A). However, it should be appreciated that a stacked body in accordance with the present disclosure is not limited thereto, and depending on particular embodiments, the second planar conductive layer may be equal to or greater in size in at least one of its two extending dimensions than at least some of its underlying first planar dielectric layers and/or dielectric layer, and still may be arranged in a manner that cover only a portion(s) of the upper surface of the first conductive layer.

In one embodiment, capacitor 100 may further include first and second contacts 130a and 130b (which, hereinafter, may be collectively referred to by example as metal lines 130) (e.g., metal contacts, poly-silicon contacts, etc.) respectively coupled to the upper surfaces of first and second planar conductive layers 121a and 121b, and first and second contact electrodes 140a and 140b (hereinafter may be collectively referred to as contact electrodes 140) respectively disposed on and coupled to first and second metal lines 130a and 130b. First and second metal lines 130a and 130b may be buried inside an interlayer dielectric layer 150, and first and second contact electrodes 140a and 140b may be disposed on interlayer dielectric layer 150 to be respectively coupled to first and second metal lines 130a and 130b.

By way of a non-limiting example, metal lines 130 may respectively extend in the direction substantially perpendicular to the upper surfaces of planar conductive layers 120 (e.g., in the direction indicated by the z axis shown in FIG. 1A). It should be appreciated that the term "substantially perpendicular," as used herein, includes, but is not limited to, a range of from −30 to +30 degrees around the perpendicular direction. While metal lines 130 are illustrated as an elongated rectangular structure, they may take one of a variety of different shapes. For example, metal lines 130 may be, but are not limited to, a cylinder or a tapered column.

The aforementioned elements of capacitor 100 may respectively be made of various different materials. For example, substrate 110 may be fabricated from one or more materials, which include, but are not limited to, sapphire, glass, or semiconductor materials (e.g., silicon (Si), germanium (Ge), and gallium arsenide (GaAs)). Planar conductive layers 121 and dielectric layer 122 may be respectively made of a conductive material (e.g., polysilicon) and an oxide of the conductive material (e.g., silicon oxide) in any available manner. Metal lines 130 and contact electrodes 140 may respectively be made of tungsten and aluminum. Interlayer dielectric layer 150 may be made of borophosphosilicate glass (BPSG). It should be appreciated, however, that the aforementioned materials are given for illustrative purposes only, and other materials may be used as appropriate depending on each implementation.

In the embodiment described with reference to FIGS. 1A-1C, planar conductive layers 121 and dielectric layer 122 are arranged in a way such that first conductive layer 121a includes one or more portions (e.g., first and second upper surface portions 12a and 12b) not covered by overlying second conductive layer 121b and dielectric layer 122, so as to allow forming of one or more contacts (e.g., first metal line 130a) and one or more contact electrodes (e.g., first contact electrode 140a) from top-down. The aforementioned arrangement not only allows its easy fabrication using one or more of existing semiconductor fabrication techniques (e.g., concurrently with other semiconductor devices, such as an array of three-dimensional non-volatile memory cells), but also allows attaining high capacitance, to a level hitherto not possible, by, for example, stacking similarly configured additional planar conductive layers and dielectric layers therein.

Figure 2A:
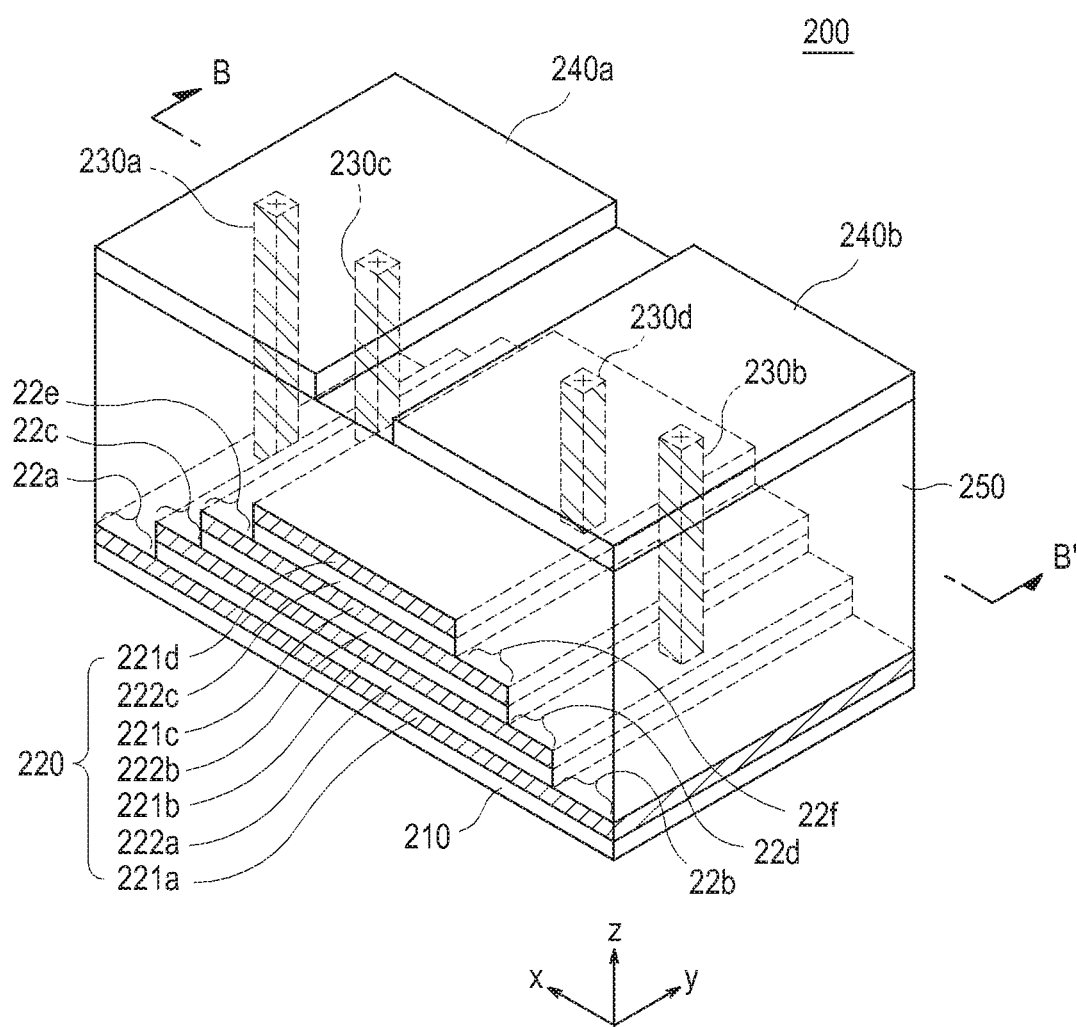
FIG. 2A shows a perspective view of another illustrative embodiment of a capacitor.
Figure 2B:
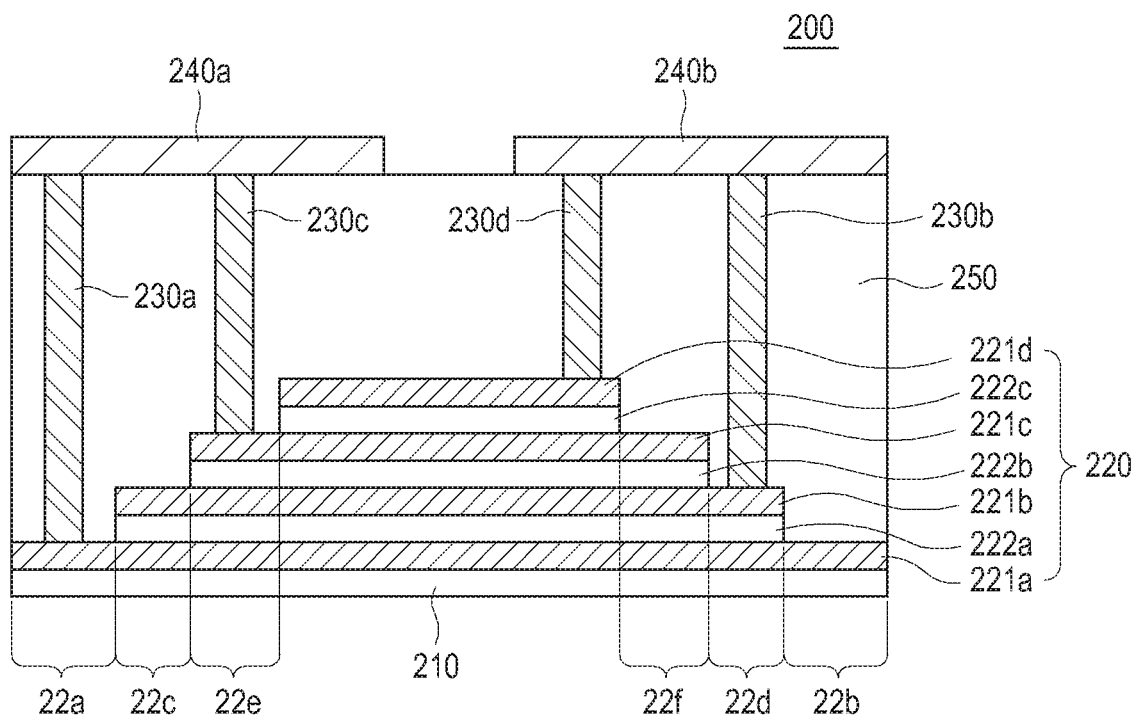
FIG. 2B shows a cross-sectional view of the capacitor shown in FIG. 2A taken along line B-B'.
Figure 2C:
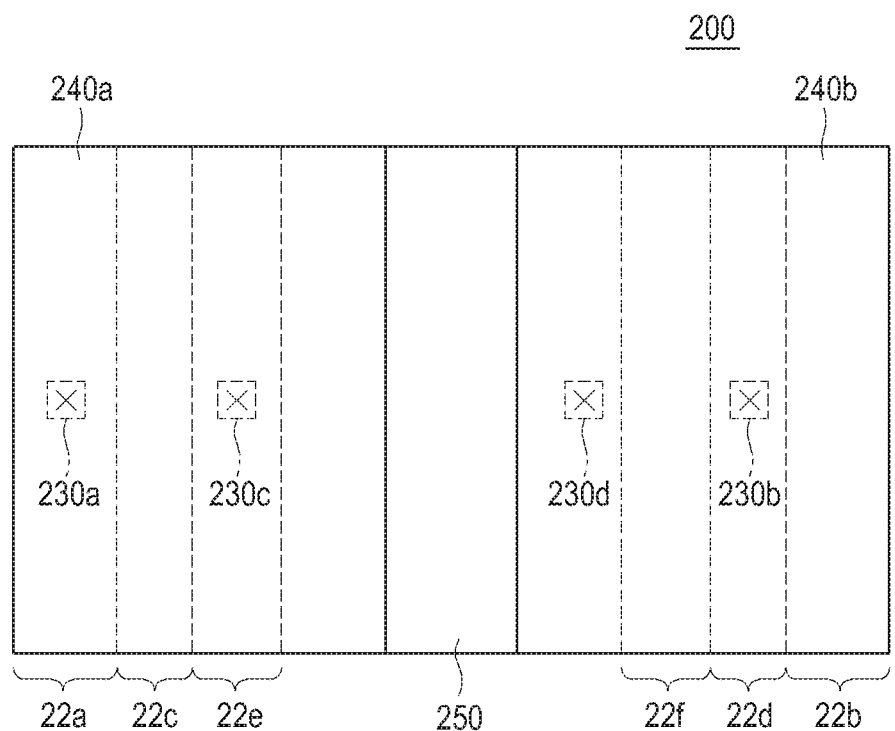
FIG. 2C shows a planar view of the capacitor shown in FIG. 2A.

In this regard, FIGS. 2A-2D show another illustrative embodiment of a capacitor. FIG. 2A shows a perspective view of another illustrative embodiment of a capacitor. FIG. 2B shows a cross-sectional view of the capacitor shown in FIG. 2A taken along line B-B'. FIG. 2C shows a planar view of the capacitor shown in FIG. 2A. FIG. 2I) shows a schematic circuit diagram of the capacitor shown in FIG. 2A. Referring to FIGS. 2A-2D, a capacitor 200 may include a substrate 210, a stacked body 220, a plurality of contacts 230a-230d (which, hereinafter, may be collectively referred to by example as metal lines 230), first and second contact electrodes 240a and 240b (which hereinafter may be collectively referred to as contact electrodes 240), and an interlayer dielectric layer 250. While not expressly illustrated in FIGS. 2A-2D for the sake of simplicity, a dielectric material, such as silicon oxide, may be interposed between substrate 210 and stacked body 220. Stacked body 220 may include N planar conductors (e.g. N planar conductive layers 221a-221d, which hereinafter may be collectively referred to as planar conductive layers 221) respectively disposed one above the other and N−1 dielectrics (e.g. N−1 dielectric layers 222a-222c, which hereinafter may be collectively referred to as dielectric layers 222) respectively interposed between two adjacent conductive layers 221. While stacked body 220 of the illustrative embodiment shown in FIGS. 2A-2D include four planar conductive layers 221 and three dielectric layers 222 (i.e., N is equal to 4), a stacked body in accordance with the present disclosure is not limited thereto, and may include any number of planar conductive layers and dielectric layers (e.g., N may be equal to a natural number equal to or greater than 2). It should be noted that numerals in FIGS. 2A-2D that are similar to those in FIGS. 1A-1C generally identify similar components, and unless context dictates otherwise, the descriptions provided with reference to FIGS. 1A-1C generally apply to corresponding components in FIGS. 2A-2D.

Planar conductive layers 221 and dielectric layers 222 may be alternately disposed one above the other to respectively cover only a portion(s) of the upper surfaces of its underlying planar conductive layers 221, such that each of planar conductive layers 221 may include at least one portion (e.g. upper surface portions 22a-22f) not covered by its overlying planar conductive layers 221 and dielectric layers 222. By way of a non-limiting example, the at least one upper surface portion may be an end portion of one of planar conductive layers 221, such that the upper surface portions collectively form one or more stair steps at one or more sides of stacked body 220 of capacitor 200 (e.g., the two steps respectively at the right and left sides of stacked body 220 viewed in the direction of the y axis shown in FIG. 2A).

In one embodiment, as shown in FIGS. 2A-2C, each of planar conductive layers 221 may be smaller than all of its underlying planar conductive layers 221 in at least one of its two extending dimensions (e.g., the two dimensions in the direction of x and y axes shown in FIG. 2A). Further, in the above embodiment, each of planar conductive layers 221 may be equal to or smaller than all of its underlying planar dielectric layers 222 in at least one of its two extending dimensions (e.g., the two dimensions in the direction of x and y axes shown in FIG. 2A). However, it should be appreciated that a stacked body in accordance with the present disclosure is not limited thereto, and depending on particular embodiments, may include one or more planar conductive layers that are equal to or greater in size than all or some of its underlying planar dielectric layers and/or dielectric layers in at least one of its two extending dimensions.

One set of the plurality of contacts 230 (e.g., metal lines 230a and 230c) may be disposed at one side of stacked body 220 of capacitor 200 (e.g., the left side of stacked body 220 viewed in the direction of the y axis shown in FIG. 2A) and may be respectively coupled to the upper surface portions of alternate ones of planar conductive layers 221 (e.g., odd-numbered planar conductive layers 221) that are not covered by respective overlying planar conductive layers 221 and dielectric layers 222 (e.g., upper surface portions 22a and 22e of planar conductive layers 221a and 221c). Further, another set of the plurality of contacts 230 (e.g., metal lines 230b and 230d) may be disposed at another side of stacked body 220 of capacitor 200 (e.g., the right side of stacked body 220 viewed in the direction of the y axis shown in FIG. 2A) and may be respectively coupled to one of the upper surface portions of the remaining ones of the planar conductive layers (e.g., even-numbered planar conductive layers 221), some of which are not covered by respective overlying planar conductive layers 221 and dielectric layers 222 (e.g., upper surface portions 22d of planar conductive layers 221b). First contact electrode 240a may be disposed on and coupled to the one set of the plurality of contacts lines 230, whereas second contact electrode 240b may be disposed on and coupled to the another set of the plurality of contacts 230. Contacts 230 may be buried inside interlayer dielectric layer 250, and contact electrodes 240 may be disposed on interlayer dielectric layer 250 to be coupled to contacts 230.

Figure 2D:
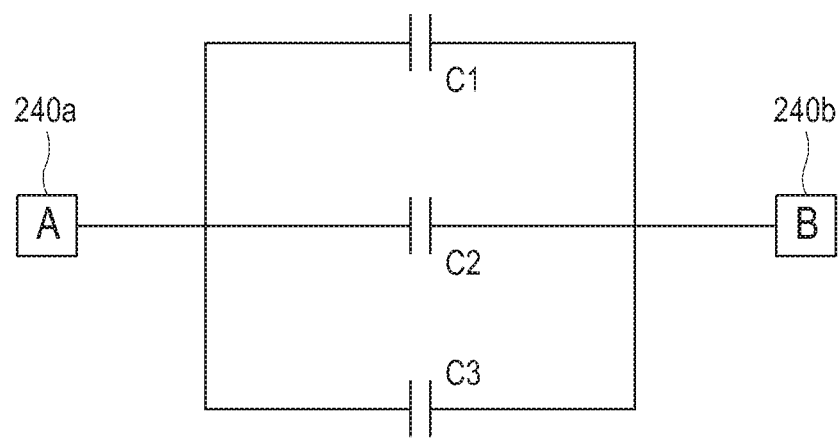
FIG. 2D shows a schematic circuit diagram of the capacitor shown in FIG. 2A.

As can be seen from FIG. 2D, the aforementioned arrangement of stacked body 220 is the equivalent of N−1 capacitors connected in parallel between two nodes A and B respectively corresponding to contact electrodes 240a and 240b. In the example shown in FIG. 2D, C1, C2, and C3 respectively represent capacitances provided between planar conductive layers 221a and 221b, planar conductive layers 221b and 221c, and planar conductive layers 221c and 221d. Between each pair of conductive layers, one capacitance is provided at the center portions of the planar conductive layer pair and another capacitance is provided at the end portions of the planar conductive layer pair. In some embodiments, the total capacitance provided by stacked body 220 may be expressed by Equation 1 shown below.

$$C_{total} = C_{center} + C_{side} \quad \text{[Equation 1]}$$
$$= \beta * (W * L * P_n + W * a * (S-2) * (S-1))$$

where, $C_{total}$ is the total capacitance provided by stacked body 220, $C_{center}$ is the capacitance provided between the center portions of planar conductive layers 221 in stacked body 220, $C_{side}$ is the capacitance provided between the end portions of planar conductive layers 221 in stacked body 220, β is the unit capacitance between a planar conductive layer pair, W is the length of planar conductive layers 221 along the y axis shown in FIG. 2A, L is the length of planar conductive layer 221d along the x axis shown in FIG. 2A, $P_n$ is the number of dielectric layers 222 (i.e., N−1), S is the number of planar conductive layers 221 (i.e., N), and α is the length of an upper surface portion 22a-22d along the x axis shown in FIG. 2A. As can be appreciated from FIG. 2D and Equation 1 shown above, the total capacitance provided by capacitor 200 is proportional to and thus may be increased by stacking similarly configured additional planar conductive layers and dielectric layers in its stacked body 220.

In the illustrative embodiment shown in FIGS. 2A-2D, contact electrodes 240a and 240b are disposed above two stair steps located at two opposing ends of capacitor 200. This is the same for the illustrative embodiment shown in FIGS. 1A-1C. It should be appreciated, however, that contact electrodes in accordance with the present disclosure (and contacts to be coupled thereto) may be disposed in a variety of different ways.

Figure 3A:
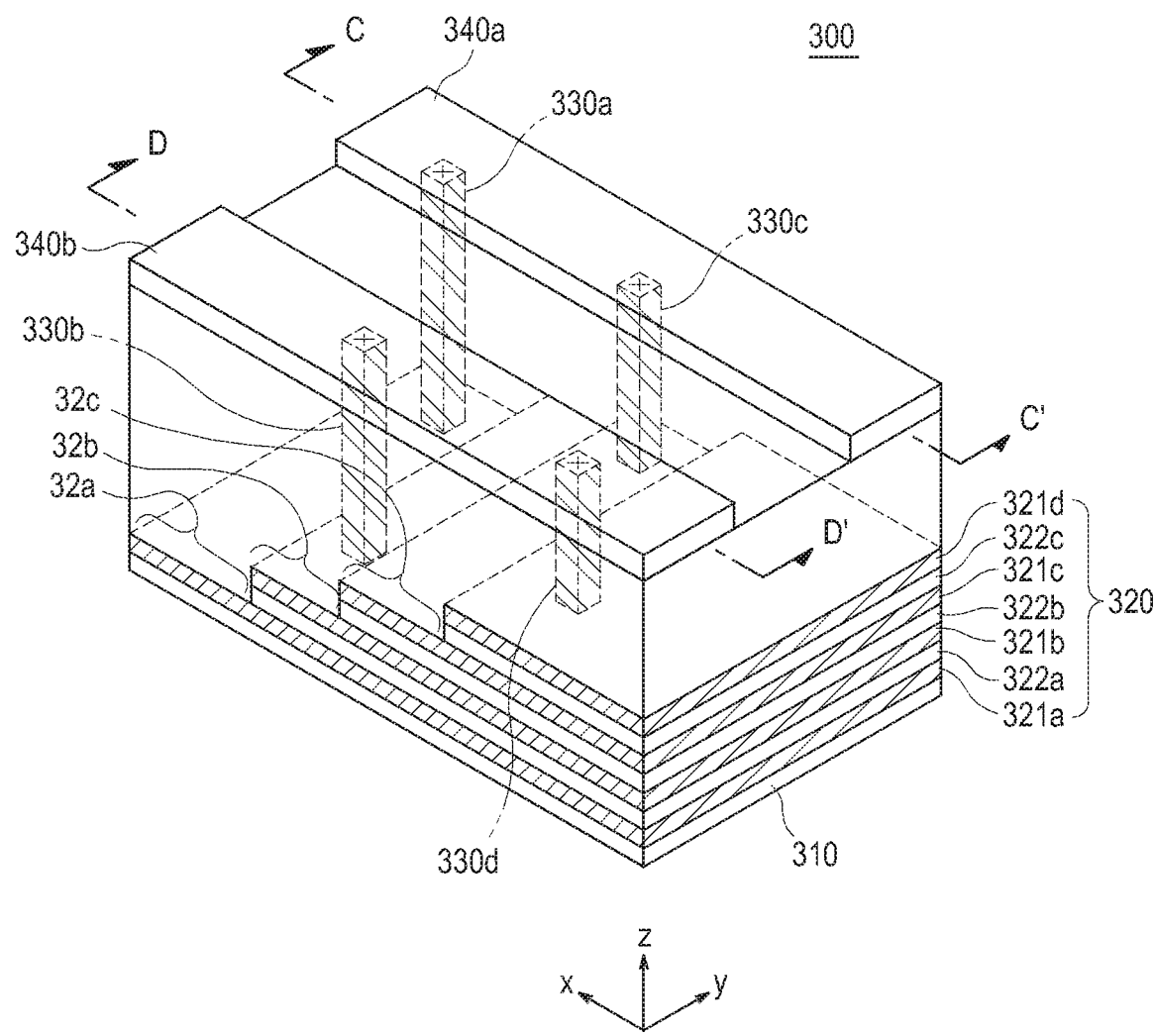
FIG. 3A shows a perspective view of yet another illustrative embodiment of a capacitor.
Figure 3B:
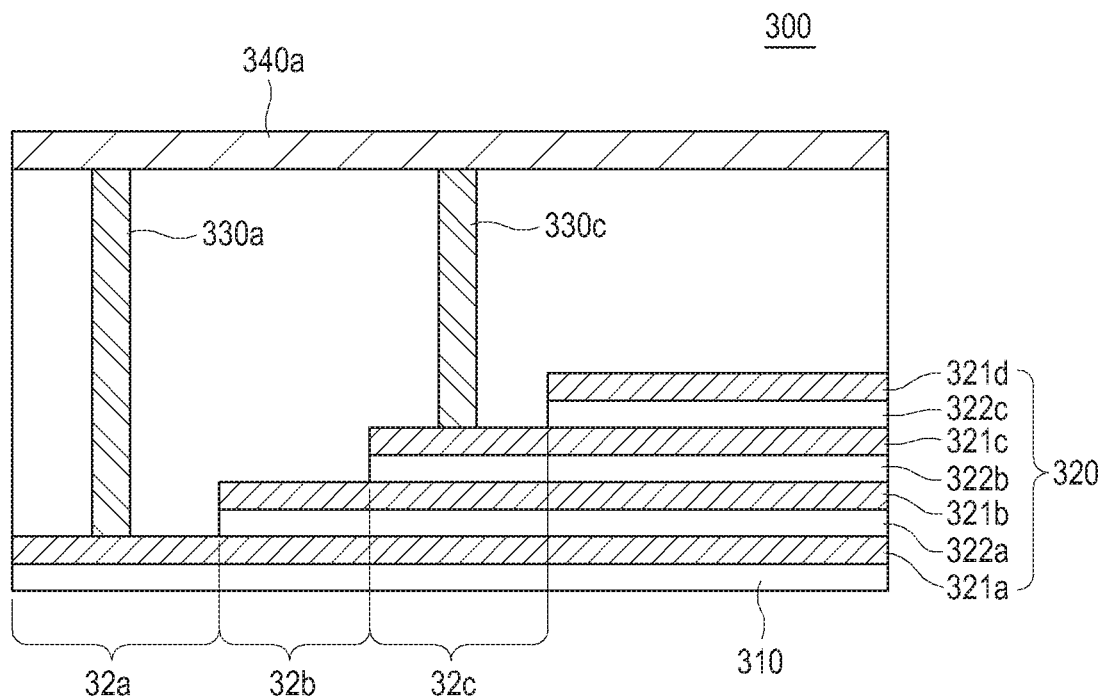
FIG. 3B shows a cross-sectional view of the capacitor shown in FIG. 3A taken along line C-C'.
Figure 3C:
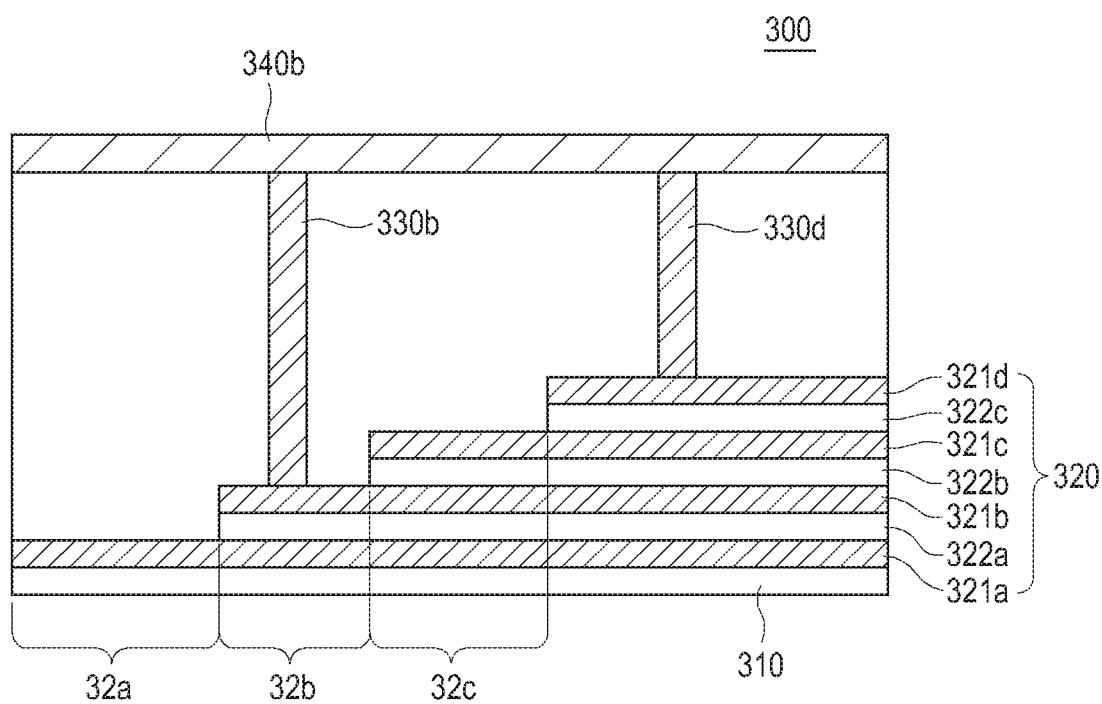
FIG. 3C shows a cross-sectional view of the capacitor shown in FIG. 3A taken along line D-D'.
Figure 3D:
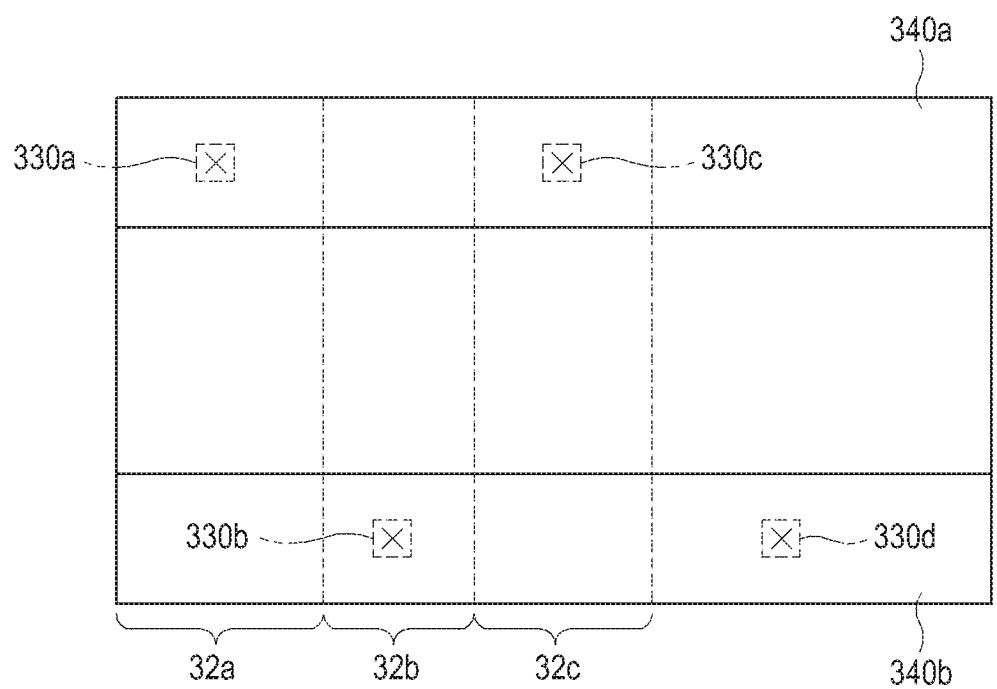
FIG. 3D shows a planar view of the capacitor shown in FIG. 3A.

In this regard, FIGS. 3A-3D show another illustrative embodiment of a capacitor. FIG. 3A shows a perspective view of yet another illustrative embodiment of a capacitor. FIG. 3B shows a cross-sectional view of the capacitor shown in FIG. 3A taken along line C-C. FIG. 3C shows a cross-sectional view of the capacitor shown in FIG. 3A taken along line D-D'. FIG. 3D shows a planar view of the capacitor shown in FIG. 3A. Referring to FIGS. 3A-3D, a capacitor 300 may include a substrate 310, a stacked body 320, a plurality of contacts 330a-330d (which, hereinafter, may be collectively referred to by example as metal lines 330), first and second contact electrodes 340a and 340d (which hereinafter may be collectively referred to as contact electrodes 340), and an interlayer dielectric layer 350. Stacked body 320 may include N planar conductors (e.g. N planar conductive layers 321a-321d, which hereinafter may be collectively referred to as planar conductive layers 321, where N is a natural number greater than or equal to 2) respectively disposed one above the other and N−1 dielectrics (e.g. N−1 dielectric layers 322a-322c, which hereinafter may be collectively referred to as dielectric layers 322) respectively interposed between two adjacent conductive layers 321a-321d. While not expressly illustrated in FIGS. 3A-3D for the sake of simplicity, a dielectric material, such as silicon oxide, may be interposed between substrate 310 and stacked body 320. Numerals in FIGS. 3A-3D similar to those in FIGS. 1A-1C and 2A-2D generally identify similar components, and unless context dictates otherwise, the descriptions provided with reference to FIGS. 1A-1C and 2A-2D generally apply to corresponding components in FIGS. 3A-3D. For the sake of simplicity, some of the features of capacitor 300 that are similar to those of capacitors 100 and 200 may not be described in the ensuing descriptions.

In one embodiment, planar conductive layers 321 and dielectric layers 322 may be alternately disposed one above the other to respectively cover end portions at one side of each upper surface of its underlying planar conductive layers 321, such that each of planar conductive layers 321 may include an end portion at the opposing side of its upper surface (e.g. upper surface portions 32a-32c) that is not covered by its overlying planar conductive layers 221 and dielectric layers 322, while the end portion on the one side of its upper surface is completely covered by its overlying planar conductive layers 321 and dielectric layers 322. In the above embodiment, planar conductive layers 321 and dielectric layers 322 collectively form only one stair step at the one side of stacked body 320 of capacitor 300 (e.g., the step at the left side of capacitor 300 viewed in the direction of the y axis shown in FIG. 3A), as opposed to two stair steps along the both sides of each of stacked bodies 120 and 220 in capacitors 100 and 200 of FIGS. 1A-1C and 2A-2D.

In the above embodiment, one set of the plurality of contacts 330 (e.g., metal lines 330a and 330c) may be disposed adjacent to one lateral side of the step formed by stacked body 320 (e.g., the direction along the x axis shown in FIG. 3A) and coupled to the upper surface portions of a first set of conductors, such as odd-numbered planar conductive layers 321 (e.g., upper surface portions 32a and 32c of planar conductive layers 321a and 321c). Further, another set of the plurality of contacts 330 (e.g., metal lines 330b and 330d) may be disposed adjacent to the other lateral side of the step formed by stacked body 320 (e.g., the direction along the x axis shown in FIG. 3A) and coupled to the upper surface portions of a second set of conductors, such as even-numbered planar conductive layers 321, some of which are not covered by its overlying planar conductive layers 321 and dielectric layers 322 (e.g., upper surface portions 32d of planar conductive layers 321b).

Further, first and second contact electrodes 340a and 340b may both be disposed along a direction substantially parallel to the lateral sides of the step formed on stacked body 320 (e.g., the direction along the x axis shown in FIG. 3A) and be spaced apart from each other by a prescribed distance in a direction perpendicular to the lateral sides of the step formed on stacked body 320 (e.g., the direction along the y axis shown in FIG. 3A), such that first contact electrode 340a may be coupled to a set of contacts coupled to the upper surface portions of odd-numbered planar conductive layers 321, while second contact electrode 340b may be coupled to another set of contacts coupled to the upper surface portions of even-numbered planar conductive layers 321. Contacts 330 may be buried inside interlayer dielectric layer 350, and contact electrodes 340 may be disposed on interlayer dielectric layer 350 to be coupled to contacts 330.

In the illustrative embodiment shown in FIGS. 1A-1C, 2A-2D and 3A-3D, capacitors 100-300 each include two contact electrodes. It should be appreciated, however, that capacitors in accordance with the present disclosure may include three or more contact electrodes.

Figure 4A:
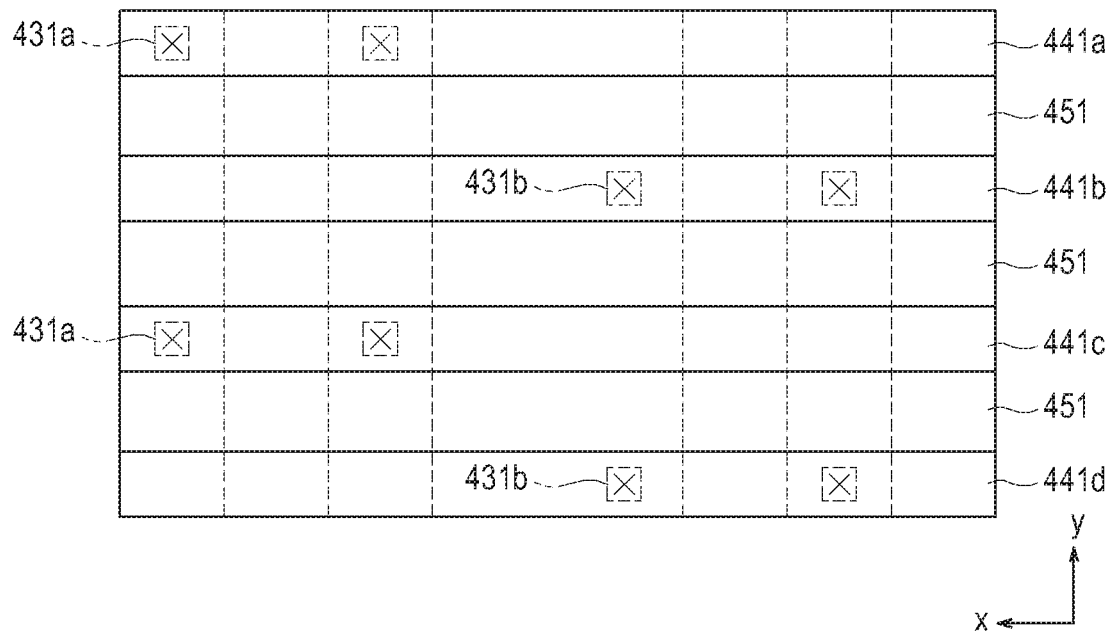
FIGS. 4A and 4B show a planar view of illustrative embodiments of capacitors including four contact electrodes.
Figure 4B:
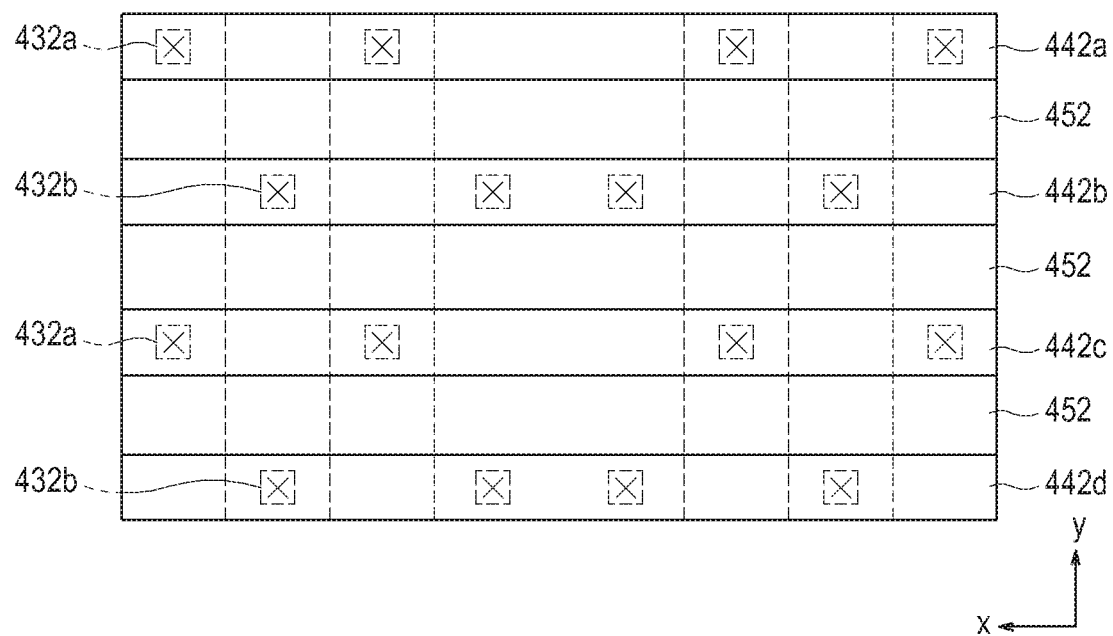

In this regard, FIGS. 4A and 4B show a planar view of illustrative embodiments of capacitors including four contact electrodes. Referring to FIGS. 4A and 4B, each of capacitors 401 and 402 include four contact electrodes (i.e., contact electrodes 441a-441d and 442a-442d) that are disposed in a direction perpendicular to the lateral sides of the steps formed in capacitors 401 and 402 (e.g., the direction along the x axis shown in FIGS. 4A and 4B). Two contact electrodes that are disposed on contacts coupled to a first set of planar conductors, such as odd-numbered planar conductive layers (e.g., contact electrodes 441a and 441c coupled to contacts 431a in FIG. 4A, and contact electrodes 442a and 442c coupled to contacts 432a in FIG. 4B) are alternately arranged with the other two contact electrodes that are disposed on contacts coupled to a second set of planar conductors, such as even-numbered planar conductive layers (e.g., contact electrodes 441b and 441d coupled to contacts 431b in FIG. 4A, and contact electrodes 442b and 442d coupled to contacts 432b in FIG. 4B). In FIG. 4A, contacts 431a and 431b are disposed on only one of the two side of capacitor 401 viewed in the direction perpendicular to the lateral sides of the steps thereon (e.g., each of the left and right sides of capacitor 401 viewed in the direction of the y axis shown in FIG. 4A). In FIG. 4B, however, contacts 432a and 432b are disposed on both sides of capacitor 402 viewed in the direction perpendicular to the lateral sides of the steps thereon (e.g., both sides of capacitor 402 viewed in the direction of the y axis shown in FIG. 4B). The arrangements of contact electrodes shown in FIGS. 4A and 4B may provide, further to the capacitance provided by their stacked bodies, additional capacitance between the contact electrodes.

Figure 5:
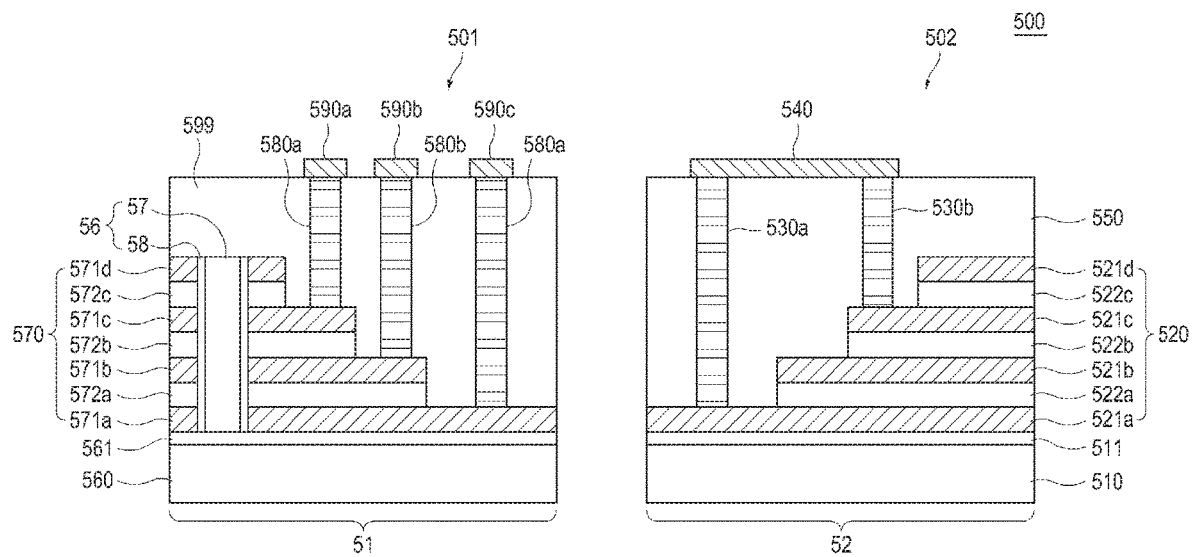
FIG. 5 shows a cross-sectional view of an illustrative embodiment of a flash memory device including a capacitor.

The capacitors described in conjunction with the preceding figures may be fabricated into a variety of semiconductor devices to be used as a passive circuit element therein. Especially, by virtue of their structural configurations hitherto described, capacitors in accordance with the present disclosure may be fabricated concurrently with other semiconductor elements, such as a three-dimensional memory cell array structure of a flash memory device. In this regard, FIG. 5 shows a cross-sectional view of an illustrative embodiment of a flash memory device including a capacitor in accordance with the present disclosure. Referring to FIG. 5, a flash memory device 500 may include a memory cell array region 51 and a periphery region 52.

Memory cell array region 51 may include a three-dimensional memory cell array structure 501. Three-dimensional memory cell array structure 501 may include a substrate 560, a dielectric layer 561 located on substrate 560, and a stacked body 570 located on dielectric layer 561 and alternately stacked with planar conductors (e.g. planar conductive layers 571a-571d) and dielectrics (e.g. dielectric layers 572a-572c). Stacked body 570 may include one or more pillar-shaped semiconductor structures (e.g., a pillar-shaped semiconductor structure 56) that may respectively function as a string of three dimensional flash memory cells. Each pillar-shaped memory structure may include, for example, a silicon pillar (e.g., a silicon pillar 57) and an oxide-nitride-oxide (ONO) film (e.g., an ONO film 58) encircling the silicon pillar. Each planar conductive layer 571a-571d functions as a word line for controlling the portion of pillar-shaped memory structure 56 it encircles. For example, the portion of ONO film 57 surrounded by planar conductive layer 571a may function as a transistor that turns on and off depending on the voltage applied by planar conductive layer 571a functioning as a word line thereto. Each planar conductive layer 571a-571c is respectively connected to contact electrodes 590a-590c through contacts 580a-580c formed in a dielectric layer 599 to be supplied with program and other types of voltages. The concrete configurations of a three-dimensional memory cell array structure are well known in the pertinent art, and are not further described for the sake of simplicity.

Periphery region 52 may be formed with a variety of structures/circuits for operating three-dimensional memory cell array structure 501. For example, periphery region 52 may include one or more capacitors in accordance with the present disclosure to supply necessary voltages to three-dimensional memory cell array structure 501 and/or other parts of flash memory device 500. In this regard, FIG. 5 shows a portion 502 of such a capacitor. The capacitor may include a substrate 510, a dielectric layer 511 located on substrate 510, and a stacked body 520 located on dielectric layer 511 and alternately stacked with planar conductors (e.g. planar conductive layers 521a-521d) and dielectrics (e.g. dielectric layers 522a-522c). Each planar conductive layer 521a-521c is respectively connected to one of multiple contact electrodes (e.g., a contact electrode 540) through one of contacts 530 (e.g., contacts 530a and 530b) formed in an dielectric layer 550 to be supplied with a charging voltage. As can be appreciated from FIG. 5, the configuration of the three-dimensional memory cell array structure and the capacitor have similar structural configuration, thus, the capacitor may be fabricated in conjunction with and/or concurrently with the three-dimensional memory cell array structure in the memory cell array region. Further, the above similarity allows fabrication of the capacitor, for example, by using the structure(s) that are naturally formed in the peripheral region during the fabrication of the three-dimensional memory cell array structure in the memory cell array region. This will become clearer as we describe an example fabrication process of a capacitor in accordance with this disclosure with regard to FIGS. 7 and 8A-8G.

Figure 6:
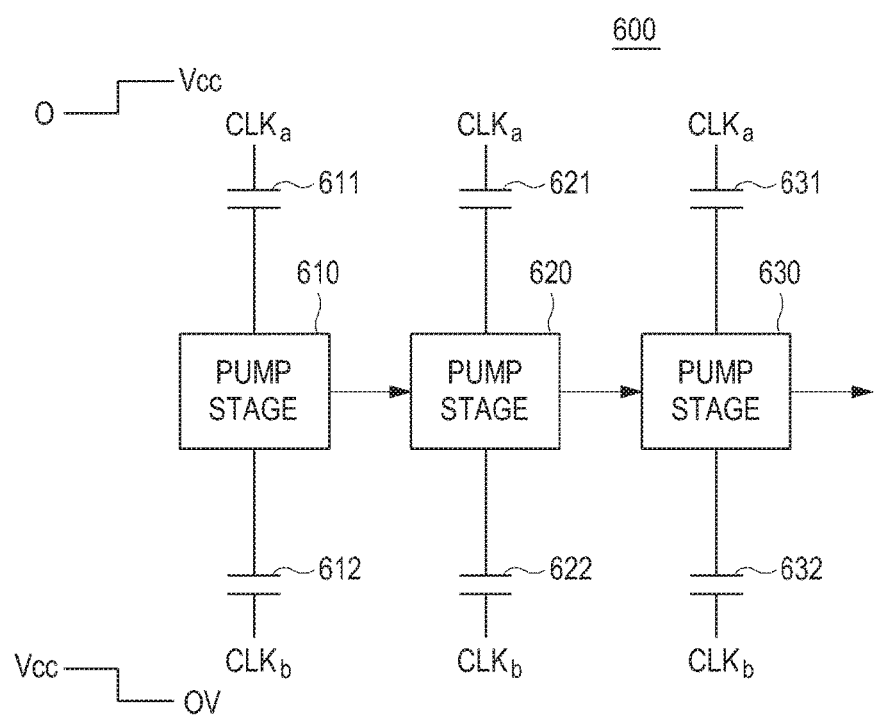
FIG. 6 shows an illustrative embodiment of a charge pump including multiple capacitors.

The capacitors described in conjunction with the preceding figures may be used for a variety of devices formed in a peripheral region of a semiconductor device. By way of a non-limiting example, capacitors in accordance with the present disclosures may be used as capacitive elements in a charge pump for providing voltages, for example, to contact electrodes 590a-590c of three-dimensional memory cell array structure 501 shown in FIG. 5. In this regard, FIG. 6 shows an illustrative embodiment of a charge pump including multiple capacitors in accordance with the present disclosure. Referring to FIG. 6, a charge pump 600 may include a plurality of pump stages 610-630 respectively coupled to capacitors 611 and 612, 621 and 622, and 631 and 632. Capacitors 611, 621, and 631 may be provided with a clock pulse $CLK_a$, while capacitors 611, 621, and 631 may be provided with a clock signal $CLK_b$, which is of the same magnitude as clock signal $CLK_a$ but shifted in phase by 180 degrees. The above capacitors may store energy when clock pulse $CLK_a$ or $CLK_b$ is at Vcc [V], and discharge the energy stored therein when clock pulse $CLK_a$ or $CLK_b$ is at 0 [V]. Each pump stage 610-630 is made of one or more transistors that, when provided with voltage signals discharged from the capacitors, turns on and conveys the voltage signals provided thereto as output. The capacitors in FIG. 6 may provide greater capacitance and store more energy than conventional capacitors (e.g., MOSFET capacitors), while being smaller in size. This allows increasing the voltage output of charge pump 600 without adding an additional pump stage(s) thereto (i.e., without increasing the size and cost of charge pump 600).

Figure 7:
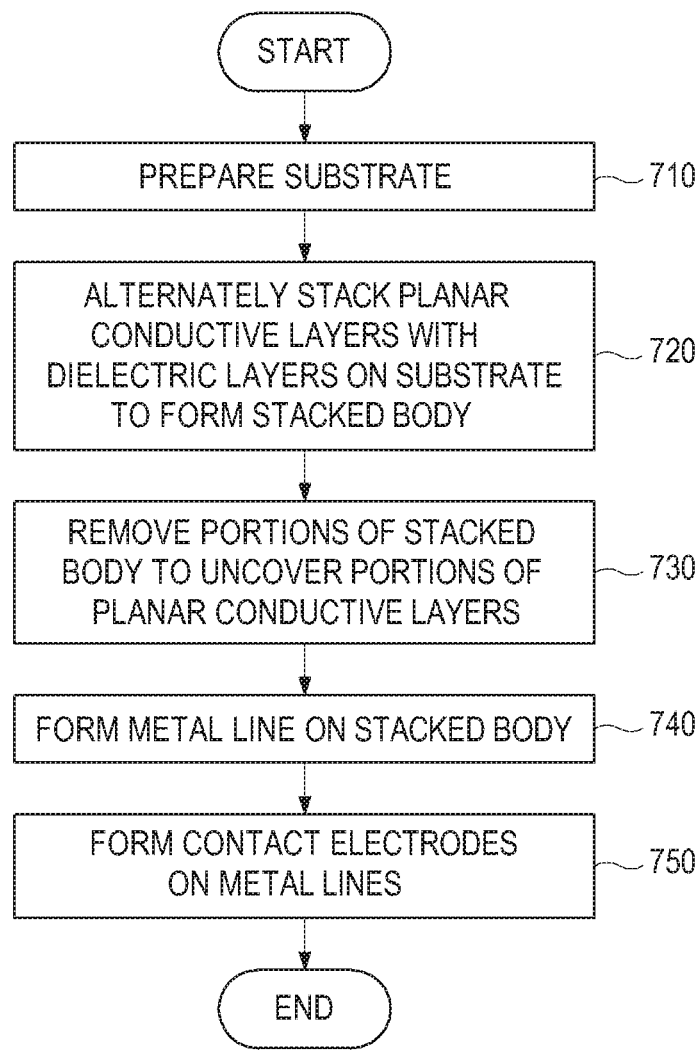
FIG. 7 shows an example flow diagram of an illustrative embodiment of a method for fabricating a capacitor.
Figure 8A:
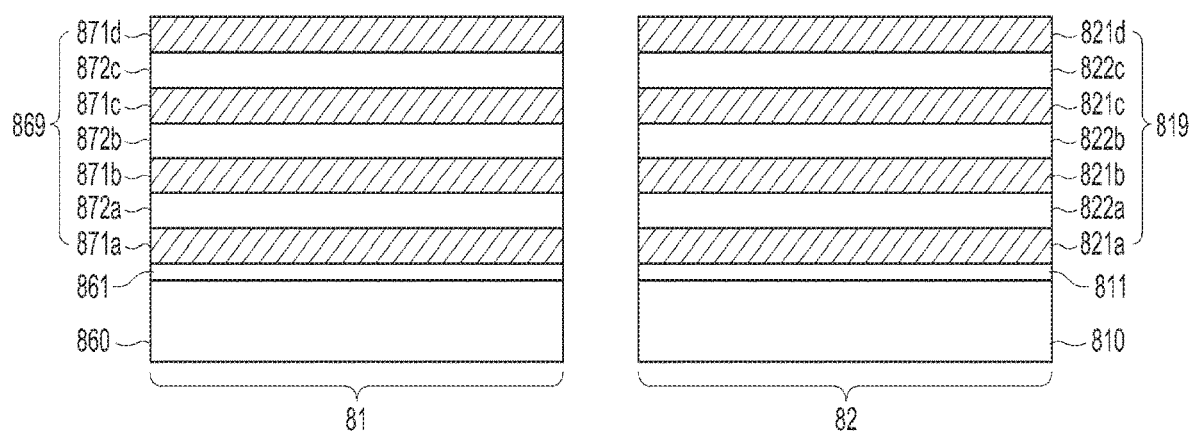
FIGS. 8A-8G are a series of diagrams illustrating the example method shown in FIG. 7 and the structures fabricated by the example method.

A method for fabricating a capacitor is explained hereafter with reference to FIGS. 7 and 8A-8G. FIG. 7 shows an example flow diagram of an illustrative embodiment of a method for fabricating a capacitor. Referring to FIG. 7, a substrate may be prepared (block 710). The substrate, for example, may be prepared by using any of the materials described above with reference to FIGS. 1A-1C (e.g., materials described above with reference to FIG. 1A through FIG. 1C such as, for example, sapphire, glass, or semiconductor materials (e.g., silicon (Si), germanium (Ge), and gallium arsenide (GaAs). In one embodiment, the substrate may be a substrate for a flash memory device including a memory cell array region and a peripheral region. In block 720, N planar conductors (e.g. planar conductive layers) are alternately stacked with N−1 dielectrics (e.g. N−1 dielectric layers) on the substrate to form a stacked body thereon. In the embodiment where the substrate is a substrate for a flash memory device, the planar conductive layers and the dielectric layers may be alternately stacked in both the memory cell array region and the peripheral region. In this regard, FIG. 8A shows a cross-sectional view of an illustrative embodiment of portions 819 and 869 of a stacked body respectively formed in a peripheral region 82 and a memory cell array region 81 located on substrates 860 and 810. In FIG. 8A, the planar conductive layers and the dielectric layers are respectively referenced with numerals 821a-821d and 822a-822c (for stacked body portion 820) and 871a-871d and 872a-872c (for stacked body portion 870). Further, in some embodiments, as shown in FIG. 8A, dielectric layers 861 and 811 may be located on substrates 860 and 810, respectively.

Figure 8B:
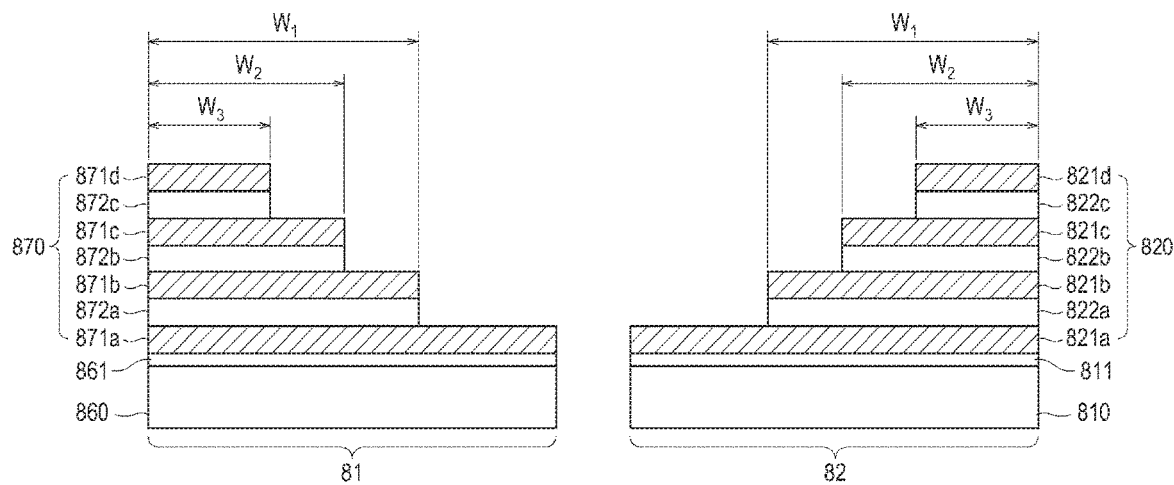

In block 730, one or more portions of the stacked body are removed to uncover one or more portions of each of the planar conductive layers that were previously covered by their overlying planar conductive and/or dielectric layers. By way of a non-limiting example, the stacked body may be etched with a mask having a width that decreases with each iteration (i.e., a mask slimmed with each iteration) to form a stair step at one or more sides of the stacked body. In the embodiment related to a flash memory device, the portions of the stacked body in both the memory cell array region and the peripheral region may be etched, for example, concurrently, so as to provide two separate stacked bodies in the respective regions. FIG. 8B shows a cross-sectional view of an illustrative embodiment of portions 820 and 870 of the stacked body respectively iteratively etched with a mask (not shown) having a width that decreases with each iteration (i.e., W1, W2, and W3) to be formed into two separate stacked bodies 820 and 860 each having a stair step. There are various techniques known in the art, including the aforementioned mask slimming technique, for fabricating the aforementioned stair-stepped structure in a stacked body, all of which may be applied to a stacked body of the present disclosure. The technical details thereon are not further described for the sake of simplicity.

Figure 8C:
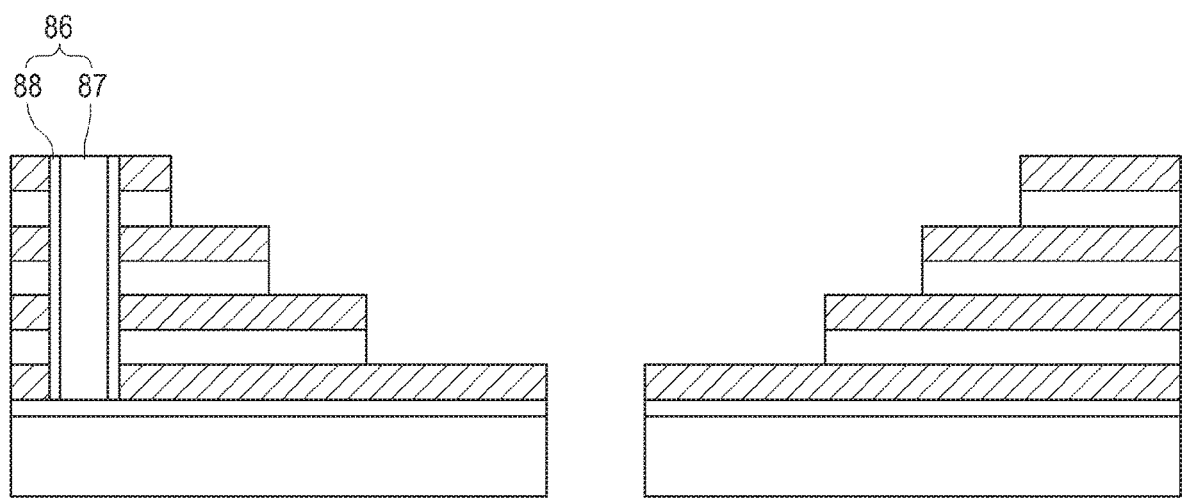

In the embodiment related to a flash memory device, before or after block 730, the stacked body in the memory cell array region may be processed to form therein one or more pillar-shaped semiconductor structures that may respectively function as a string of three dimensional flash memory cells. Each pillar-shaped memory structure may include, for example, a silicon pillar (e.g., epitaxial silicon or polysilicon) and an oxide-nitride-oxide (ONO) film encircling the silicon pillar. In this regard, FIG. 8C shows a cross-sectional view of an illustrative embodiment of a pillar-shaped semiconductor structure 86 including a silicon pillar 87 and an ONO film 88. The techniques for fabricating the aforementioned pillar-shaped semiconductor structure are well known in the pertinent art, and are not further described for the sake of simplicity.

In block 740, one or more contacts are formed on the stacked body. The one or more contacts may be substantially perpendicular to the upper surfaces of the stacked body. One set of contacts may be coupled to the uncovered portions of a first set of planar conductors (e.g. odd-numbered planar conductive layers), whereas another set of contacts may be coupled to the uncovered portions of a second set of planar conductors (e.g. even-numbered planar conductive layers).

Figure 8D:
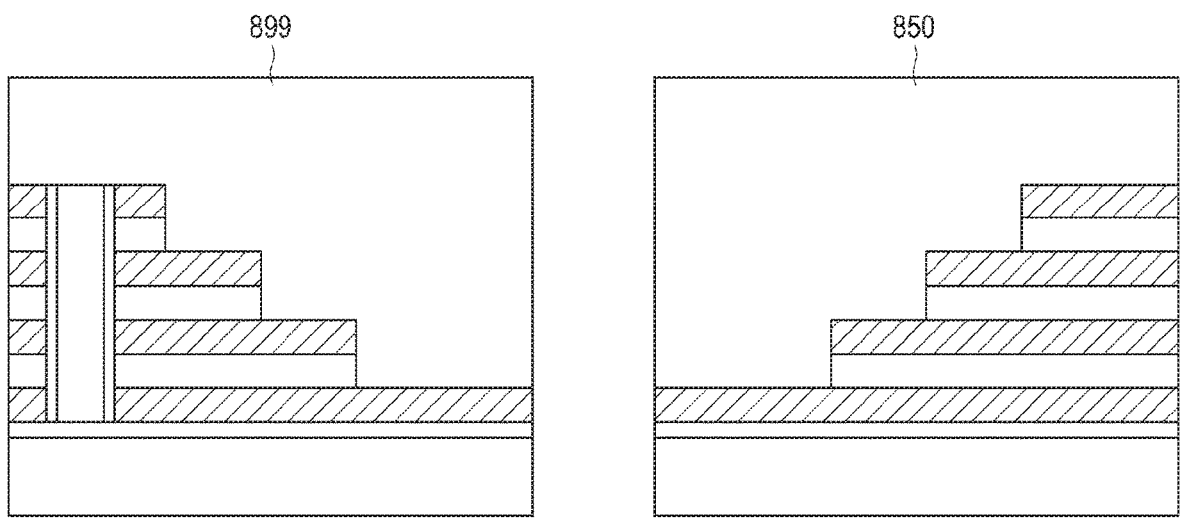
Figure 8E:
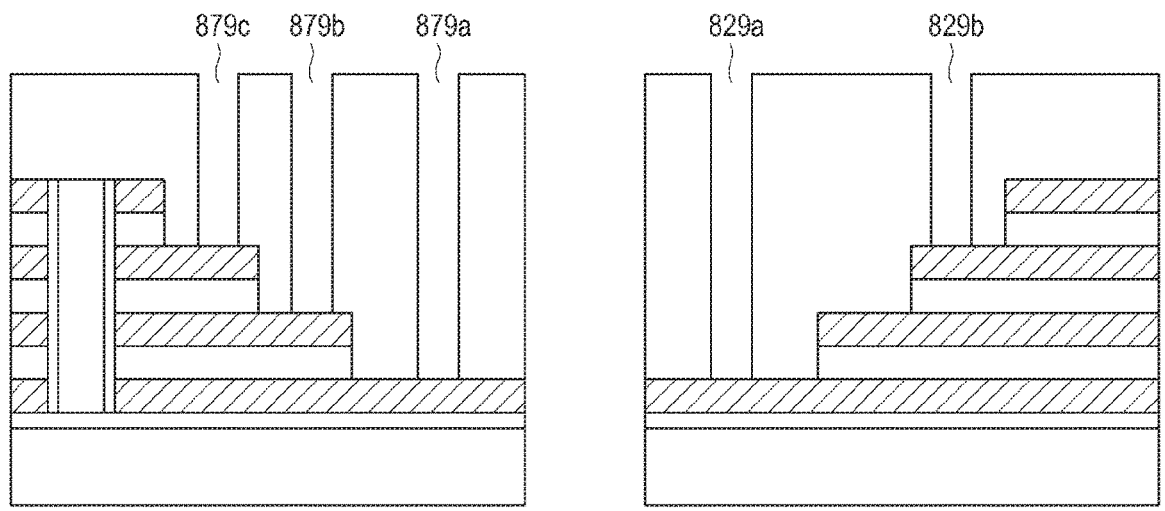
Figure 8F:
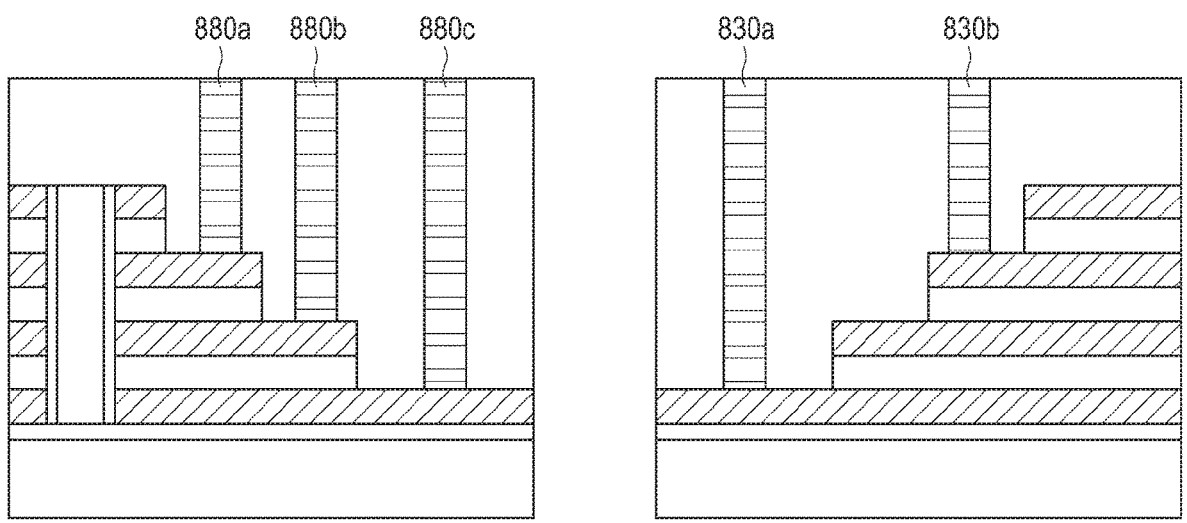

In one embodiment, the contacts may be formed by forming an interlayer dielectric layer over the stacked body, and removing one or portions of the interlayer dielectric layer above at least some of the one or more second portions of planar conductive layers to define one or more openings (e.g., holes) therethrough, and depositing conductive materials into the one or more openings to form the contacts therein. In the embodiment related to a flash memory device, one or more contacts may also be formed in the memory cell region. For example, the one or more contacts in the memory cell region may be formed concurrently with the contacts in the periphery region, by also depositing an interlayer dielectric layer in the memory cell region, forming one or more openings in the interlayer dielectric layer, and depositing a conductive material into the openings to form one or more contacts therein. In this regard, FIG. 8D shows a cross-sectional view of an illustrative embodiment of interlayer dielectric layers 850 and 899 respectively formed in periphery and memory cell array regions 82 and 81. FIG. 8E shows a cross-sectional view of an illustrative embodiment of openings 829a and 829b formed in periphery region 82 located on substrate 810, and openings 879a-879c formed in memory cell array region 81 located on substrate 860. Further, FIG. 8F shows a cross-sectional view of an illustrative embodiment of contacts 830a and 830b and contacts 880a-880c respectively formed in periphery and memory cell array regions 82 and 81.

In block 750, two or more contact electrodes are formed on the contacts. For example, a first contact electrode may be formed on a first set of contacts coupled to the odd-numbered planar conductive layers and a second contact electrode may be coupled to a second set of contacts coupled to even-numbered planar conductive layers. In one embodiment, the first and second electrodes may be formed above the first and second sides of the stacked body at which stair steps are respectively formed. In another embodiment, the first and second contact electrodes may be formed above a stair step adjacent to first and second lateral sides of the stair step, respectively. Further, in yet another embodiment, in addition to the first and second electrodes, additional contact electrodes may be formed. For example, third and fourth contact electrodes may be respectively formed to be disposed on and coupled to at least some of the first set of contacts and at least some of the second set of contacts. The third contact electrode may be interposed between and adjacent to the second and fourth contact electrodes to provide capacitance between at least the second and third contact electrodes or the third and fourth contact electrodes.

Figure 8G:
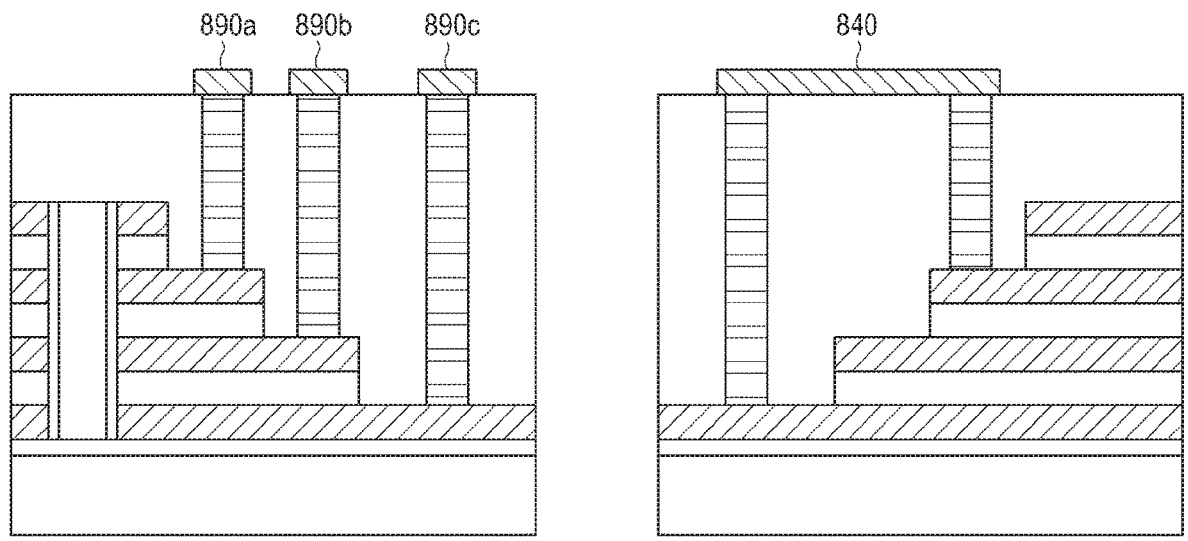

In the embodiment related to a flash memory device, one or more contact electrodes may also be formed in the memory cell region. In this regard, FIG. 8G shows a cross-sectional view of an illustrative embodiment of a contact electrode 840 formed in peripheral region 82 for a capacitor in accordance with present disclosure and contact electrodes 890a-890c for the three-dimensional memory cell array formed in memory cell array region 81.

As can be appreciated from FIGS. 8A-8G, a capacitor may be formed by using a portion of a stacked body of alternating planar conductive layers and dielectric layers that is naturally formed in the peripheral region as well as the memory cell array region during the process of fabricating a flash memory device. Further, by virtue of its structural configuration, a capacitor in accordance with the present disclosure may be formed in conjunction with and/or concurrently with the memory cell array structure (e.g., a three-dimensional memory cell array structure) in the memory cell array region.

Figure 9:
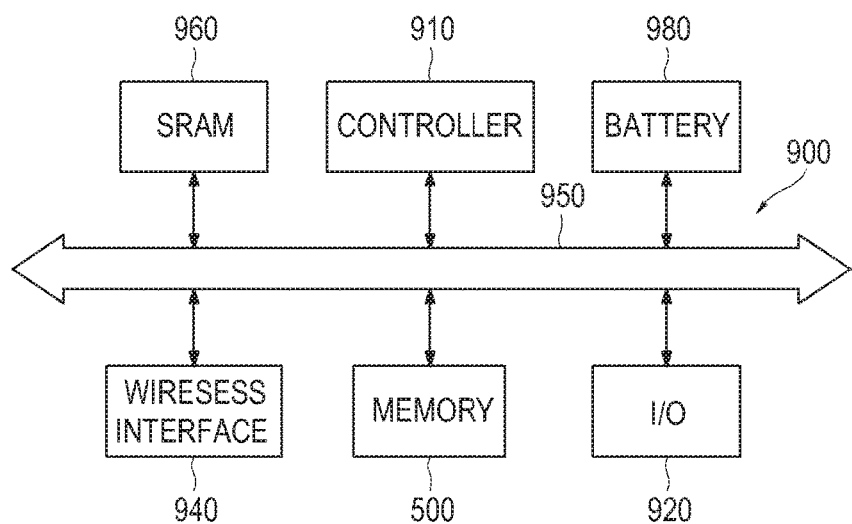
FIG. 9 shows a schematic diagram of an illustrative embodiment of a system including a non-volatile memory device.

FIG. 9 shows a schematic diagram of an illustrative embodiment of a system including a non-volatile memory device (e.g., a flash memory device 500 of FIG. 5). A system 900 may be used in devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information either wirelessly or over a wire connection. The system 900 may be used in any of the following systems: a wireless local area network (WLAN) system, a wireless personal area network (WPAN) system, or a cellular network.

The system 900 may include a controller 910, an input/output (I/O) device 920 (e.g., a keypad, display), the flash memory device 500 of FIG. 5, a wireless interface 940, and a static random access memory (SRAM) 960 and coupled to each other via a bus 950. A battery 980 may supply power to the system 900 in one embodiment. The memory device may include a NAND memory, a flash memory, a NOR memory, or the like.

The controller 910 may include, for example, one or more microprocessors, digital signal processors, micro-controllers, or the like. The flash memory device 500 may be used to store messages transmitted to or by the system 900. The flash memory device 500 may also optionally be used to store instructions that are executed by controller 920 during the operation of the system 900, and may be used to store user data either generated, collected or received by the system 900 (such as image data). The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information.

The I/O device 920 may be used to generate a message. The system 900 may use the wireless interface 940 to transmit and receive messages to and from a wireless communication network with a radio frequency (RF) signal. Examples of the wireless interface 940 may include an antenna, or a wireless transceiver, such as a dipole antenna, although the scope of the present disclosure is not limited in this respect. Also, the I/O device 920 may deliver a voltage reflecting what is stored as either a digital output (if digital information was stored), or as analog information (if analog information was stored). While an example in a wireless application is provided above, embodiments of the present invention may also be used in non-wireless applications as well.

It should be appreciated that the structural and functional configurations of a capacitor, a semiconductor device, and/or a system and their elements described in conjunction with FIGS. 1A-9 are indicative of a few ways in which a capacitor, a semiconductor device, and/or a system may be implemented. It should be appreciated that a capacitor in accordance with this disclosure may be applied to any type of devices and systems, including types of memories other than flash memory.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases one or more or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third, and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of forming a memory structure, comprising:
    forming a three-dimensional (3D) memory cell region; and
    forming a peripheral region adjacent to the memory cell region, including forming a capacitor structure including multiple conductive levels separated by dielectric levels, comprising:
        forming a first conductive level, a second conductive level above the first conductive level, and a third conductive level above the second conductive level;
        wherein the second conductive level is stepped back from an upper surface end portion of the first conductive level, and wherein the third conductive level is stepped back from an upper surface end portion of the second conductive level;
        wherein the first and second conductive levels are separated by a first dielectric level, and wherein the second and third conductive levels are separated by a second dielectric level.

2. The method of claim 1, wherein the capacitor structure forms part of a charge pump.

3. The method of claim 1, wherein forming the 3D memory cell region comprises:

forming multiple vertically offset word lines, each word line separated from at least one vertically adjacent word line level by a dielectric level;

wherein the materials of the first, second, and third conductive levels of the capacitor structure in the peripheral region are formed simultaneously with forming the material of the three vertically offset word lines.

4. The method of claim 3, wherein the material of the first, second, and third conductive levels of the capacitor structure are the same as the material of the three of the vertically offset word lines.

5. The method of claim 1, wherein each of the second and third conductive levels of the capacitor are stepped back relative to the same end of the first conductive level, forming a stairstep.

6. The method of claim 1, wherein each of the second and third conductive levels of the capacitor have a length shorter than the underlying conductive level, and wherein the second and third conductive levels are placed to form stairsteps at both ends of the capacitor structure.

7. The method of claim 1, further comprising forming a third dielectric level over the third conductive level, and forming a fourth conductive level above the third conductive level, wherein the third conductive level is stepped back from an upper surface end portion of the third conductive level.

8. The method of claim 1, further comprising multiple vertical contacts extending to a respective conductive level of the first, second, and third conductive levels.

9. The method of claim 1, wherein forming the 3D memory cell region comprises forming a stacked body comprising N planar conductive levels alternating with N−1 dielectric levels.

10. The method of claim 1, wherein forming the capacitor structure comprises forming additional conductive levels separated by respective dielectric levels.

* * * * *